United States Patent [19]
Barkat et al.

[11] Patent Number: 5,862,493
[45] Date of Patent: Jan. 19, 1999

[54] EXTERNAL POWER SOURCE TO MAIN BATTERY POWER SOURCES SWITCH

[75] Inventors: Shakil Barkat, Bartlett; Gregory Redmond Black, Vernon Hill, both of Ill.

[73] Assignee: Motorola, Inc., Schaumburg, Ill.

[21] Appl. No.: 614,604

[22] Filed: Mar. 13, 1996

[51] Int. Cl.$^6$ .................................................. H04B 1/04
[52] U.S. Cl. ........................... 455/572; 455/127; 307/66
[58] Field of Search .................... 455/550, 572,
455/573, 574, 575, 127, 343; 327/407,
424, 434, 546; 320/13.1; 307/46, 48, 64,
66, 85–87, 141, 141.4, 141.8

[56] References Cited

U.S. PATENT DOCUMENTS

| | | |
|---|---|---|
| 4,451,742 | 5/1984 | Aswell . |
| 4,962,523 | 10/1990 | Tanaka . |
| 5,036,532 | 7/1991 | Metroka et al. . |
| 5,335,263 | 8/1994 | Tsunehiro et al. ........................ 455/343 |
| 5,498,913 | 3/1996 | Moritani ................................... 307/66 |
| 5,511,234 | 4/1996 | Ha .......................................... 455/127 |
| 5,608,273 | 3/1997 | Bartlett et al. ............................. 307/66 |

FOREIGN PATENT DOCUMENTS

| | | |
|---|---|---|
| 2290646 | 1/1996 | United Kingdom . |
| 94/01912 | 1/1994 | WIPO . |

*Primary Examiner*—Thanh Cong Le
*Attorney, Agent, or Firm*—Sylvia Chen

[57] ABSTRACT

A switching circuit (30) in a portable telephone connects a gate of a field-effect transistor (Q1) to a voltage below the transistor's gate threshold voltage when the voltage at a first power source terminal (B) falls below a threshold voltage, thus disconnecting the first power source terminal (B) from a portable telephone power input terminal (B+) and connecting a second power source terminal (A) to the power input terminal (B+). The threshold voltage is set at a voltage above the minimum supply voltage of the portable telephone. The first power source terminal may be connected to a main battery and the second power source terminal may be connected to an adapter such as a battery eliminator adapter, hands-free adapter, or mobile transceiver adapter. This switching circuit prevents a call in progress from being disconnected when power sources are exchanged during a GSM burst.

16 Claims, 2 Drawing Sheets

EXTERNAL POWER SOURCE TO MAIN BATTERY POWER SOURCES SWITCH

FIELD OF THE INVENTION

This invention relates generally to radio-telephones, and more particularly to a portable telephone that can accommodate a power source change during a telephone call on a Global System for Mobile Communications platform.

BACKGROUND OF THE INVENTION

Portable telephones currently use batteries as their main power source. For example, cellular telephones use an attached or internal portable battery, and transportable telephones, sometimes called bag-phones, use a portable battery. Adapters, such as battery eliminator adapters, hands-free adapters, or mobile transceiver adapters, can be connected to a vehicle cigarette lighter to provide an external power source for augmenting the main battery. Switching from the main battery to the external power source and vice versa interrupts the power supply to the telephone and may cause termination of a cellular telephone call in process under certain conditions. For example, Global System for Mobile Communications (GSM) applications incorporate a burst mode that pulls 1.6 A or more during a burst. If the cellular telephone power supply is changed during a GSM burst, a telephone call in process may be terminated abruptly due to a failure to complete the power source switch-over during a limited switching period.

The switching period can be lengthened by using a capacitor as a charge storage device. Currently, a large 3300 $\mu$F capacitor with dimensions of 48 mm by 12 mm stores a charge during the switch-over. As portable telephones reduce in size, however, incorporating a large capacitor into a telephone is undesirable. Thus, there is a need for a portable telephone that accommodates a power source change during a telephone call without requiring a large capacitor.

SUMMARY

A switching circuit enables a portable telephone to change from a main battery power source to an external power source, such as a vehicle battery, and vice versa during a telephone call without a risk of forced call termination. A switching circuit drives a field-effect transistor (FET) to switch immediately to a second power source before the voltage at a first power source terminal drops below the minimum supply voltage required to keep the telephone turned on. Thus, this switching circuit enables the telephone to switch between various power sources without dropping a call in progress. Switching from a main portable battery to an external power source occurs most often when a portable telephone is connected to an adapter such as a battery-eliminator adapter, hands-free adapter, or mobile transceiver adapter, which is in turned powered by a vehicle battery. Switching from an external power source to a main portable battery occurs most often when the vehicle ignition is switched off. Incorporating this switching circuit into a portable telephone eliminates the need for a large capacitor as a charge storage device, which reduces the size and weight of the portable telephone.

DETAILED DESCRIPTION OF THE INVENTION

Figure 1:
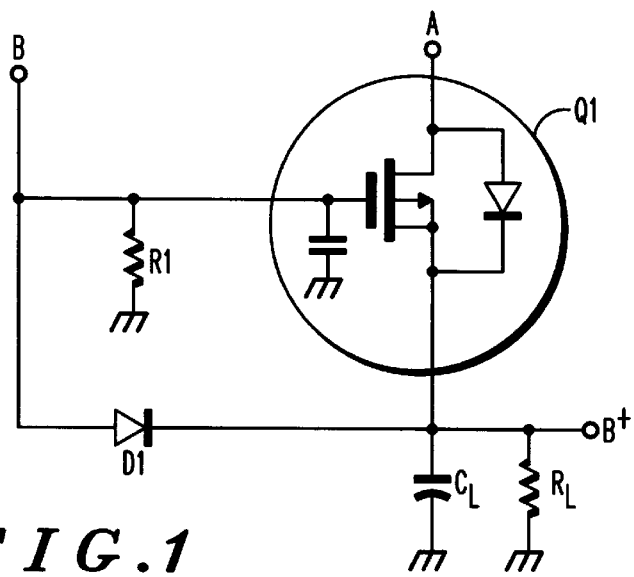
FIG. 1 shows prior art switching circuit.

FIG. 1 shows prior art switching circuit. In this circuit, main battery power source terminal A is connected to portable telephone power input terminal B+ through FET Q1, which includes an inherent diode and capacitor. External power source terminal B is connected to the gate of FET Q1 with pull-down resistor R1. Diode D1, which is preferably a Schottky diode, connects terminal B to power input terminal B+. When external power is available at terminal B, the voltage of the external power source is greater than the voltage of the main battery power source, therefore the gate of FET Q1 is high and power from the external power source is supplied to the telephone.

When external power is removed from terminal B, the voltage at the gate of FET Q1 drops and main battery power at terminal A is connected to the telephone power input terminal B+ once the gate of FET Q1 drops below the FET gate threshold voltage. The time it takes for the gate of FET Q1 to go low is determined by the amount of time it takes to discharge the inherent capacitance in the FET through resistor R1. This switch must take place before capacitor $C_L$ fully discharges through load resistor $R_L$. If the voltage at input terminal B+ drops below a threshold voltage, the telephone will turn off and any call in progress will be dropped. Thus, if the charge stored in capacitor CL is not large enough at the time of the switch-over, the FET will not switch during the short capacitor discharge period, and a telephone call in progress will be dropped. This occurs most commonly when the power sources are exchanged during a GSM burst.

Figure 2:
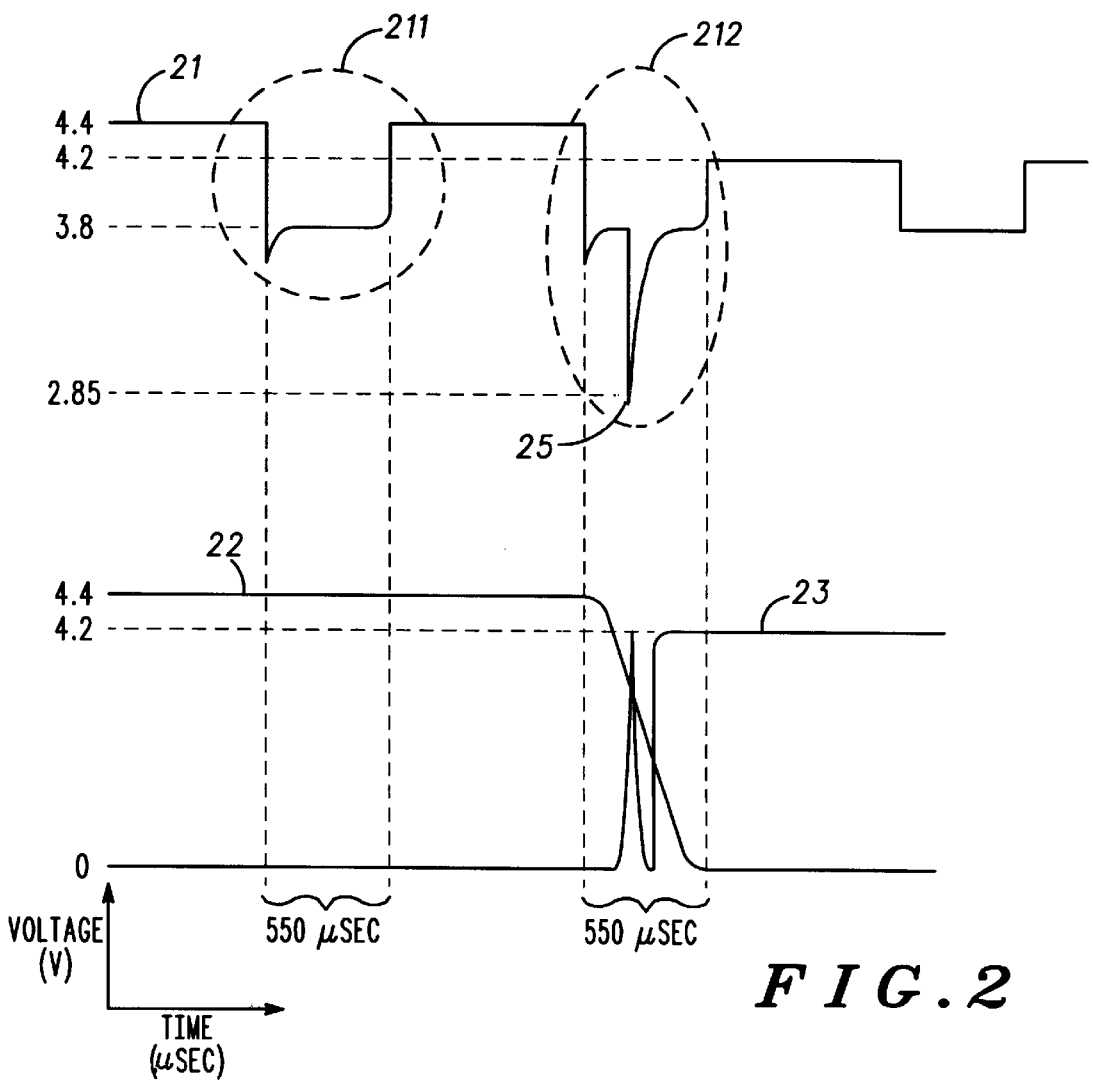
FIG. 2 shows a graph of voltage at terminals A, B, and B+ during a power source substitution.

FIG. 2 shows a graph of voltage at terminals A, B, and B+ during a power source substitution. Plot 21 shows the voltage at power input terminal B+ during a GSM burst 211 lasting approximately 550 $\mu$sec. Plot 22 shows the voltage at external power source terminal B, which in this example is the first power source. Plot 23 shows the voltage at main battery terminal A, which in this example is the second power source. Note the bounce that occurs when the second power source is inserted. If the power sources are exchanged during a burst 212, the gate of FET Q1 does not drop quickly enough to switch to the second power source before the power at input terminal B+ dips below the minimum supply or shut-off voltage of the portable telephone. The minimum supply voltage is shown at 2.85 volts, thus a call in progress would terminate at point 25.

Increasing the capacitance of capacitor CL provides additional charge at input terminal B+ during a power source exchange and increases the time available for FET Q1 to perform a switch, however, the physical size of the capacitor required to ensure that a call is not dropped during a power source exchange during a GSM burst is undesirably large.

Figure 3:
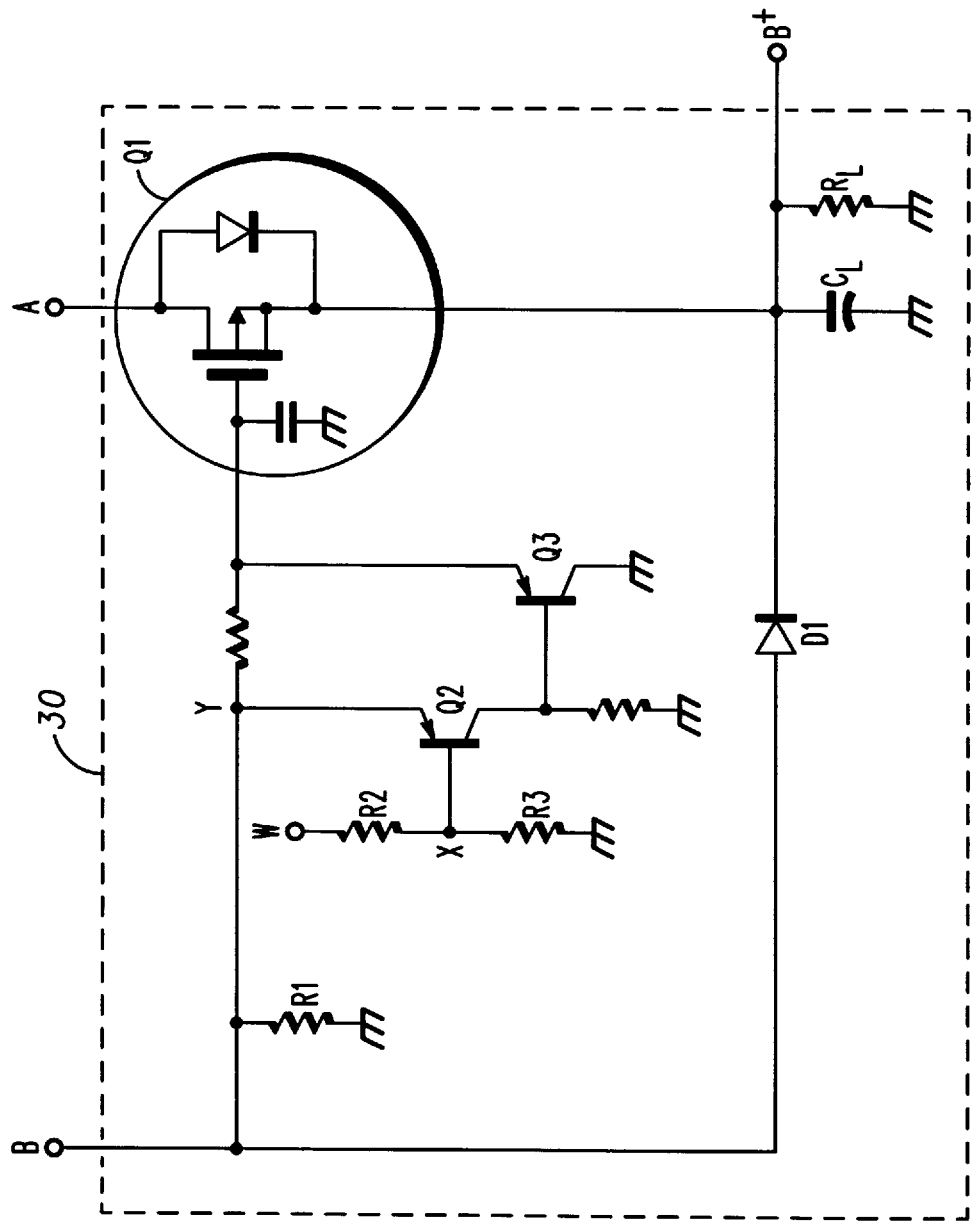
FIG. 3 shows a power source switching circuit according to a preferred embodiment.

FIG. 3 shows a power source switch according to a preferred embodiment. Switching circuit 30 eliminates the need for a bulky high-capacitance capacitor to prohibit the undesired turn-off of a telephone during a power source substitution. The voltage at node W is supplied from a linear regulator powered from input terminal B+. Resistors R2 and R3 are chosen so that the voltage at node X is preferably at least the minimum supply voltage of the telephone. The voltage at node Y would then be approximately 0.7 volts above the voltage at node X. When the voltage at terminal B drops below the threshold voltage at node Y, transistor Q2 turns off and transistor Q3 turns on, connecting the gate of FET Q1 to ground or any other voltage below the gate threshold voltage of FET Q1. Thus, switching circuit 30 forces the FET Q1 to switch over at a faster rate and eliminates the need for a large capacitance at capacitor $C_L$. With a 20 82 F capacitor $C_L$, the FET Q1 has approximately 11.4 μsec to switch from the first power source to the second power source, which is more then enough time to complete the switch-over given switching circuit 30. Conversely, when the external power source is reconnected and the voltage at terminal B exceeds the threshold voltage at node Y, transistor Q2 turns on and transistor Q3 turns off.

The voltage at node X can be set lower than the turn-off voltage of the portable telephone, however, the threshold voltage at node Y should be at least the turn-off voltage of the telephone plus the voltage across diode D1. For example, if diode D1 is a Schottky diode with a 0.4 volt drop and the minimum supply voltage of the telephone is set at 2.65 volts, the minimum threshold voltage at node Y is 3.05 volts. Thus, the switching circuit 30 eliminates the voltage drop point 25 shown in FIG. 2.

Thus, the switching circuit 30 prevents the telephone from disconnecting a call in progress even if the power source is changed during a GSM burst. The external power source to main battery power source switch eliminates the need for a large capacitor yet maintains cellular telephone calls in progress during a power source substitution. While specific components and features of the switching circuit are described above, modified components or features could be employed by one skilled in the art within the true spirit and scope of the present invention. The invention should be limited only by the appended claims.

We claim:

1. A power source switching circuit for a portable telephone having a minimum supply voltage comprising:

a first power source terminal;

a second power source terminal;

a portable telephone power input terminal;

a field-effect transistor having a gate threshold voltage for switchably connecting either the first power source terminal or the second power source terminal to the portable telephone power input terminal; and a circuit for switching a gate of the field-effect transistor below the gate threshold voltage when a voltage at the first power source terminal falls to a threshold voltage that is at least equal to the minimum supply voltage.

2. A power source switching circuit according to claim 1 wherein a first power source connected to the first power source terminal is an external power source.

3. A power source switching circuit according to claim 1 wherein a second power source connected to the second power source terminal is a portable battery.

4. A power source switching circuit according to claim 1 wherein the circuit switches the gate of the field-effect transistor above the gate threshold voltage when a voltage at the first power source terminal rises to the threshold voltage.

5. A power source switching circuit according to claim 4 wherein a first power source connected to the first power source terminal is an external power source.

6. A power source switching circuit according to claim 4 wherein a second power source connected to the second power source terminal is a portable battery.

7. A power source switching circuit according to claim 1 wherein the circuit comprises:

a first transistor having a predetermined base-emitter junction potential connected to the first power source terminal; and a second transistor having a base connected to a collector of the first transistor.

8. A power source switching circuit according to claim 7 wherein the predetermined base-emitter junction potential of the first transistor is at least equal to the minimum supply voltage.

9. A power source switching circuit according to claim 1 further comprising a diode connected to the first power source terminal and the portable telephone power input terminal.

10. A power source switching circuit according to claim 9 wherein the threshold voltage is at least equal to the minimum supply voltage plus a diode drop voltage across the diode.

11. A method for switching power sources of a portable telephone having a minimum supply voltage comprising the steps of:

detecting when a voltage at a first power source terminal falls below a threshold voltage that is at least equal to the minimum supply voltage;

connecting a gate of a field-effect transistor having a gate threshold voltage to a voltage lower than the gate threshold voltage; and using the field-effect transistor to disconnect the first power source terminal from a portable telephone power input terminal and connect a second power source terminal to the portable telephone power input terminal.

12. A method for switching power sources according to claim 11 wherein the threshold voltage is at least equal to the minimum supply voltage plus a diode drop voltage.

13. A method for switching power sources according to claim 11 wherein the step of connecting further comprises:

turning off a first transistor having a predetermined base-emitter junction potential connected to the first power source terminal; and turning on a second transistor having a base connected to a collector of the first transistor.

14. A method for switching power sources according to claim 13 wherein the predetermined base-emitter junction potential of the first transistor is at least equal to the minimum supply voltage.

15. A method for switching power sources according to claim 13 wherein the threshold voltage is at least equal to the predetermined base-emitter junction potential of the first transistor plus a voltage drop across the first transistor.

16. A power source switch for a portable telephone having a minimum supply voltage comprising:

means for switching a portable telephone power input terminal connection from a first power source terminal to a second power source terminal when a voltage at the first power source terminal falls below a threshold voltage; and means for setting the threshold voltage to be at least equal to the minimum supply voltage in order to maintain a call in progress.

\* \* \* \* \*